(12) United States Patent
Schilling et al.

(10) Patent No.: US 6,590,158 B1
(45) Date of Patent: Jul. 8, 2003

(54) PRESSURE CONTAINER WITH LAYERED SEAL ASSEMBLY

(75) Inventors: Tyler Schilling, Woodland, CA (US); William P. Klassen, Davis, CA (US); David Davis, Sacramento, CA (US)

(73) Assignee: Alstom Schilling Robotics, Davis, CA (US)

(*) Notice: Subject to any disclaimer, the term of this patent is extended or adjusted under 35 U.S.C. 154(b) by 0 days.

(21) Appl. No.: 10/099,524

(22) Filed: Mar. 15, 2002

(51) Int. Cl.[7] .................................. H05K 5/06
(52) U.S. Cl. ........................ 174/52.3; 361/752
(58) Field of Search ...................... 174/52.1, 52.3, 174/35 GC, 17.07, 17.08; 361/752

(56) References Cited

U.S. PATENT DOCUMENTS

| | | | | |
|---|---|---|---|---|
| 3,670,092 A | * | 6/1972 | Updyke et al. | 174/152 R |
| 5,393,931 A | * | 2/1995 | Guenther | 174/52.3 |
| 5,545,841 A | * | 8/1996 | Wilfinger et al. | 174/17.08 |
| 5,885,108 A | | 3/1999 | Gerrans | 439/606 |
| 5,888,083 A | | 3/1999 | Seilhan | 439/161 |
| 5,993,272 A | | 11/1999 | Wood | 439/891 |
| 6,015,872 A | | 1/2000 | Kawakita | 528/102 |
| 6,020,276 A | | 2/2000 | Hoyes | 442/185 |

* cited by examiner

*Primary Examiner*—Hung V. Ngo
(74) *Attorney, Agent, or Firm*—Sheppard, Mullin, Richter & Hampton LLP

(57) ABSTRACT

A container for housing electrical and fiber-optic components in a controlled internal environment is provided. The container is configured to define a first chamber having a first pressure which substantially differs from a second pressure in a pressure region external to the sealed chamber and that is configured to transmit signals between the sealed container and the pressure region. The container has a housing that defines the first chamber and has two spaced-apart, confronting walls extending from the first chamber to a pressure region external to the first chamber. The container further has a seal assembly positioned between the confronting walls. The seal assembly includes a planar substrate; a conductive element attached to the planar substrate and extending between the first chamber and the pressure region external to the first chamber, for conducting a signal between the first chamber and the pressure region; and sealing material positioned on opposite sides of the insulating substrate and adapted to sealably interface with the parallel confronting walls of the housing. The container further includes one or more securement members that compress the confronting walls of the housing against the seal assembly, to seal the first chamber and thereby define a boundary between the first chamber and the pressure region. The housing and the seal assembly are configured to withstand a pressure differential between the first chamber and the pressure region.

26 Claims, 4 Drawing Sheets

US 6,590,158 B1

PRESSURE CONTAINER WITH LAYERED SEAL ASSEMBLY

FIELD OF THE INVENTION

The present invention relates generally to pressure containers and, more particularly, to pressure containers that house electrical and optical components and are suitable for use in underwater applications.

BACKGROUND OF THE INVENTION

Electrical and optical components are routinely used in a variety of underwater applications. Such components have particular operational environment constraints, e.g., moisture, temperature, and pressure, in which they can be beneficially used. Many such components can experience deleterious effects when exposed conductive fluids such as water or when exposed to high pressure environments. In some underwater applications, ambient pressure can exceed 300 kilograms per square centimeter ($kg/cm^2$). Thus, it is necessary to provide a controlled environment that protects components from adverse operational conditions encountered in underwater applications, particularly, deep-sea operations, e.g., submarines, remotely operated submersibles, underwater ocean and geological instrumentation, and deep-sea diving equipment. Typically, this had been achieved by housing the components in a pressure chamber configured to withstand high external pressure and seal out water.

It is also necessary for the components housed within the pressure chamber to have connections for transmitting and receiving signals with external elements. Several types of connectors facilitating transmissions between the components within the chamber and the external elements are known in the art. Often, such connectors require physical penetrations of the chamber wall, which can cause stress concentrations and promote future failure. To minimize risks of failure, such configurations also typically require reinforced configurations and precision construction, which typically increases costs and size. Moreover, such connectors have conductors that are often individually fabricated, which further affects overall cost.

It should, therefore, be appreciated that there is a need for a cost-effective pressure container that protects electrical and fiber-optic components from the deleterious effects of water and high pressure, while enabling the components to communicate with external elements. The present invention fulfills this need as well as others.

SUMMARY OF THE INVENTION

A pressure container is provided that houses electrical and fiber-optic components in a controlled internal environment. The container is configured to define a first chamber having a first pressure which substantially differs from a second pressure in a pressure region external to the sealed chamber and that is configured to transmit signals between the sealed container and the pressure region. The container has a housing that defines the first chamber and has two spaced-apart, confronting walls extending from the first chamber to a pressure region external to the first chamber. The container further has a seal assembly positioned between the confronting walls. The seal assembly includes a planar substrate; a conductive element attached to the planar substrate and extending between the first chamber and the pressure region external to the first chamber for conducting a signal between the first chamber and the pressure region; and sealing material positioned on opposite sides of the insulating substrate and adapted to sealably interface with the parallel confronting walls of the housing. The container further includes one or more securement members that compress the confronting walls of the housing against the seal assembly, to seal the first chamber and thereby define a boundary between the first chamber and the pressure region. The housing and the seal assembly are configured to withstand a pressure differential between the first chamber and the pressure region.

In a preferred embodiment of the invention, the pressure region is external to the housing.

In another preferred embodiment of the invention, the pressure region is bound within the housing and the second pressure level is adjustably maintained at ambient pressure.

In a detailed aspect of a preferred embodiment, the housing and the seal assembly are configured to maintain a pressure within the first chamber that is at least 100 $kg/cm^2$ greater than ambient pressure.

Another detailed aspect of a preferred embodiment, the planar substrate and the conductive element are made of printed circuit board material.

Other features and advantages of the invention should become apparent from the following description of the preferred embodiment, taken in conjunction with the accompanying drawings, which illustrate, by way of example, the principles of the invention.

BRIEF DESCRIPTION OF THE DRAWINGS

Embodiments of the present invention will now be described, by way of example only, with reference to the following drawings in which.

DESCRIPTION OF THE PREFERRED EMBODIMENTS

Figure 1:
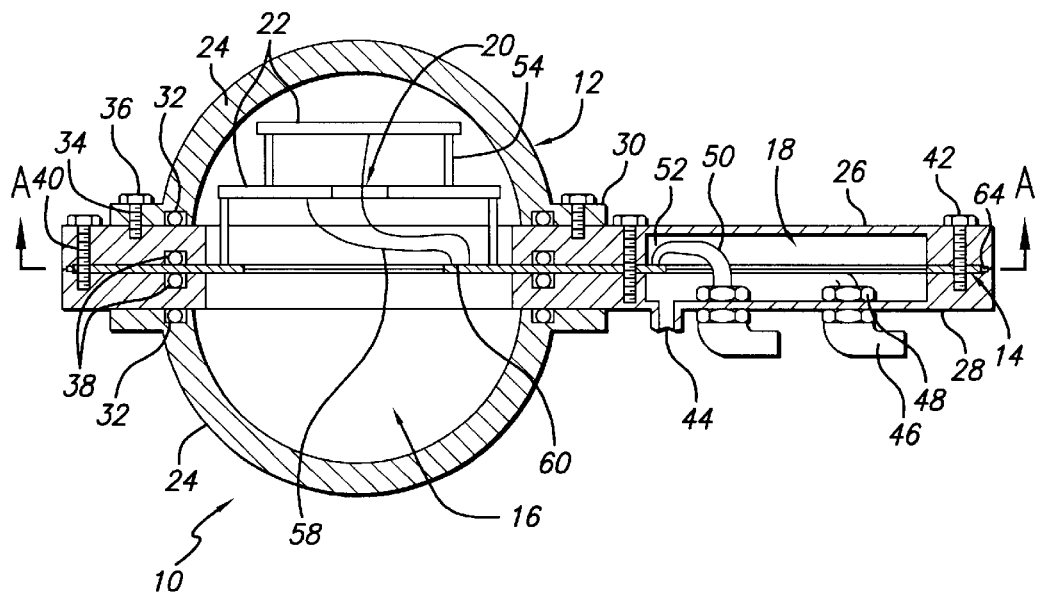
FIG. 1 is a side cross-sectional view of a preferred embodiment of a pressure container in accordance with the invention.

In this section, the present invention is described in detail with regard to the figures briefly described above. With reference to the illustrative drawings, and particularly to FIG. 1, there is shown a preferred embodiment of the present invention in a pressure container 10 for use in the protection of electrical and fiber-optic components in underwater applications, particularly, deep-sea operations, e.g., submarines, remotely operated submersibles, underwater ocean and geological instrumentation, and deep-sea diving equipment. For purposes of orientation, the line A—A depicted in FIG. 1 defines a horizon line and positional references shall be relative thereto.

The pressure container 10 includes a housing assembly 12 and a seal assembly 14, which cooperatively provide an atmospheric chamber 16 and an ambient chamber 18. The atmospheric chamber has a predetermined pressure, and the ambient chamber has a pressure substantially matching water pressure external to the container, i.e., ambient pressure. In this embodiment, the atmospheric chamber has a volume of approximately 3000 cubic centimeters. Positioned within the atmospheric chamber is a component assembly 20 that includes circuit boards 22 for mounting components (not shown). The atmospheric chamber preferably is maintained at a pressure of approximately one atmosphere (1.03 kg/cm$^2$), providing a pressure-stabilized environment for the components. In contrast, ambient pressure in some underwater applications can exceed 300 kg/cm$^2$, corresponding to a substantial pressure differential between the atmospheric chamber and ambient pressure. Beneficially, only those portions of the container providing the atmospheric chamber are required to withstand this pressure differential, thereby manifesting some of the economic, size and weight benefits of the present invention.

With continued reference to FIG. 1, the housing assembly 12 includes atmospheric covers 24 and chamber plates 26 and 28, which for convenience of reference are referred to as upper and lower chamber plates, respectively. The atmospheric covers are made of anodized aluminum having a thickness of approximately one centimeter, providing a crush strength of 540 kg/cm$^2$, other materials and thickness can also be used. The chamber plates have confronting inner surfaces and are positioned between the atmospheric covers. Each atmospheric cover is generally hemispherical in shape and has a flange 30 extending horizontally about the periphery thereof that defines a channel for receiving a cover O-ring 32. The cover O-rings are situated between each atmospheric cover and the corresponding chamber plate. The flanges and the chamber plates further define cover holes 34 with threads in chamber plate portion of the holes, for securing the cover bolts 36 in place. The cover bolts are threaded into the cover holes, securing the atmospheric covers to the chamber plates and compressing the cover O-rings therebetween. With the cover bolts in place, the cover O-rings facilitate a waterproof and pressure-resistant seal between the atmospheric covers and the chamber plates configured to withstand a pressure differential in excess of 300 kg/cm$^2$.

With continued reference to FIG. 1, the seal assembly 14 is positioned between the upper and lower chamber plates 26, 28 and includes O-rings 38 positioned adjacent to the chamber plates. The chamber plates and the seal assembly define chamber holes 40 for receiving chamber bolts 42. The chamber bolts secure the chamber plates and sandwich the seal assembly therebetween, forming a liquid-proof and pressure-resistant planar seal. Beneficially, the seal assembly is relatively thin and the resulting seal is formed without the need of large deflections.

The chamber plates 26, 28 and the seal assembly 14 cooperatively form the ambient chamber 18. The lower chamber plate 28 has a fitting 44 configured to connect to a reservoir of the non-conductive fluid (not shown). In this embodiment, the fluid used is mineral oil, however, other non-conductive fluids with similar properties may be used. The fluid pressure is adjustably maintained to provide the ambient chamber with a pressure substantially matching ambient pressure. Preferably, maintenance of the fluid density is performed by a compensator system (not shown), as commonly known in the art. Thereby, the ambient chamber provides an environment free from negative effects of exposing its contents to water, and those portions of the container providing the ambient chamber need not be configured to withstand high pressure differentials. In this embodiment, the ambient chamber is configured to have a volume of approximately 600 cubic centimeters.

The chamber plates 26, 28 are made of a comparatively light-weight, economical material, in this embodiment aluminum, fabricated by machining, other materials and fabrication techniques can also be used. In this embodiment, the lower chamber plate is configured to receive electronic connectors 46, which also are maintained at ambient pressure. The connectors are held in place to the ambient chamber and individually sealed with connector nuts 48 and low-pressure differential waterproof seals. Lead wires 50 connect the electronic connectors to connection points 52 on the sealing assembly positioned in the ambient chamber, providing pathways for power and signal transmissions between the components (not shown) and elements external to the container 10. In other embodiments, the connectors can be plugged directly to sockets of the sealing assembly.

Figure 2:
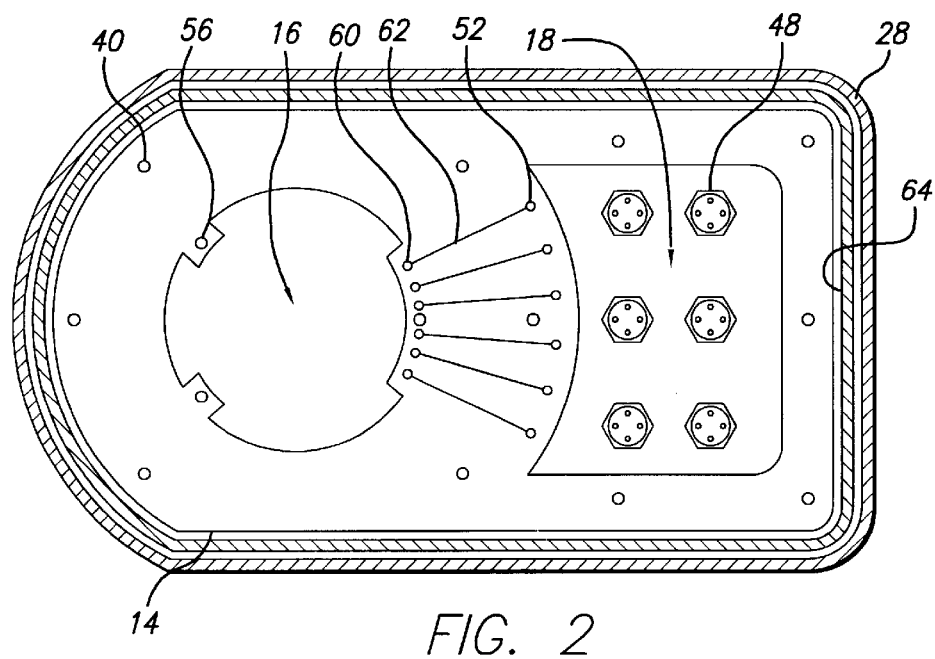
FIG. 2 is a bottom cross-sectional view of the container shown in FIG. 1 viewed along line A—A, showing the seal assembly with a sealing layer removed.

The component assembly 20 is located within the atmospheric chamber 16, and it includes circuit boards 22 held in place by stands 54. The stands are attached to the seal assembly 14 at tabs 56 (FIG. 2). Lead wires 58 connect the component assembly to connection points 60 in the atmospheric chamber and positioned on the seal assembly. Alternatively, the connections between the component assembly and the connection points on the seal assembly may be provided by other means commonly known in the art, e.g., board-to-board connectors. In other embodiments, the components can be mounted on the sealing assembly portion positioned within the atmospheric chamber. Removal of the cover bolts 36 provides quick access to the component assembly within the atmospheric chamber. Beneficially, the container 10 can be reconfigured for different uses with relative ease by replacing the component assembly 20 with another component assembly configured for a selected use.

With reference to FIG. 2, the seal assembly further includes conductive elements 62, which provide pathways for power and signal transmissions between the component assembly 20 and external elements without the need of openings or penetrations of the atmospheric chamber or other portions of the housing assembly 12 that bear forces resulting from high pressure differentials. More particularly, the. conductive elements connect connection points 52 and 60, providing a path for power and signal transmissions between the atmospheric chamber 16 and the ambient chamber 18. In this embodiment, the container 10 further includes a perimeter O-ring 64 which aids in providing a water-proof external seal and in protecting the seal assembly 14 from moisture absorption.

Figure 3:
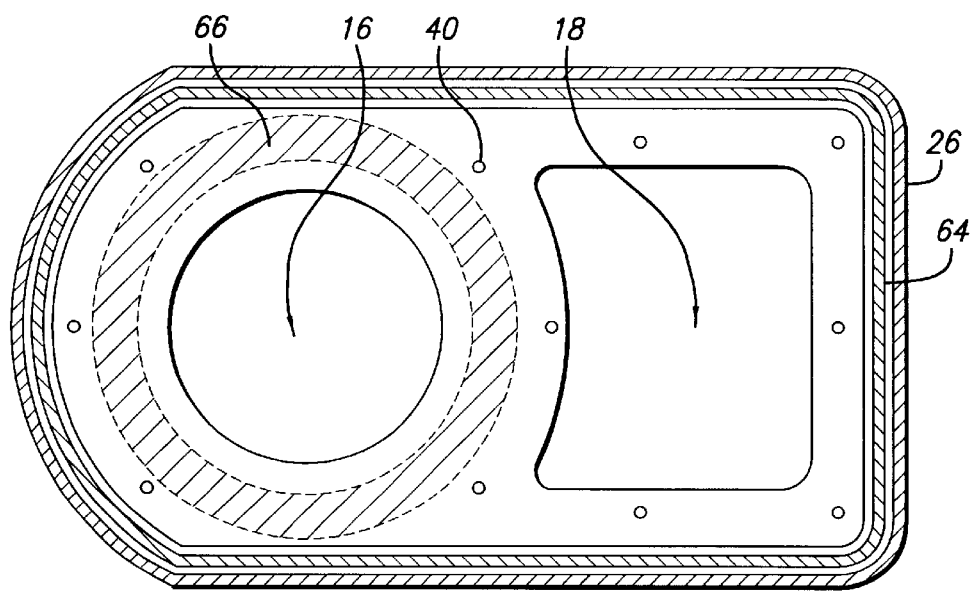
FIG. 3 is a top cross-sectional view of the container shown in FIG. 1 viewed along line A—A, showing the sealing layer with the cross-hatched area depicting a high-stress area resulting from a pressure differential between the atmospheric chamber and the ambient chamber.
Figure 4:
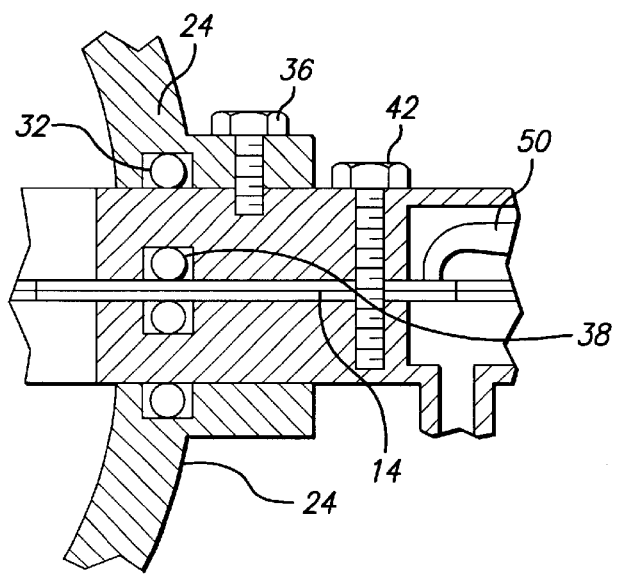
FIG. 4 is a side sectional view of the container shown in FIG. 1 depicting a region between the atmospheric chamber and the ambient chamber.

With reference to FIG. 3, a high-stress area 66 between the atmospheric chamber 16 and ambient pressure regions is depicted. As previously mentioned, the atmospheric chamber is maintained at approximately one atmosphere (1.03 kg/cm$^2$). In use, ambient pressure can exceed 300 kg/cm$^2$, corresponding to a substantial pressure differential between the atmospheric chamber and ambient pressure. Thus, the seal between the chamber plates 26, 28 and the seal assembly 14 is configured to withstand a substantial pressure differential. More particularly, high stresses resulting from the pressure differential are focused primarily in area 66. Beneficially, O-rings 38 (FIGS. 1 and 4) are positioned in proximity to the high-stress area to aid in maintaining a liquid-proof and pressure-resistant seal. FIG. 4, depicts a close-up view of a portion of the high-stress region between the atmospheric chamber 16 and the ambient chamber 18 showing the positioning of O-rings 38.

Figure 5:
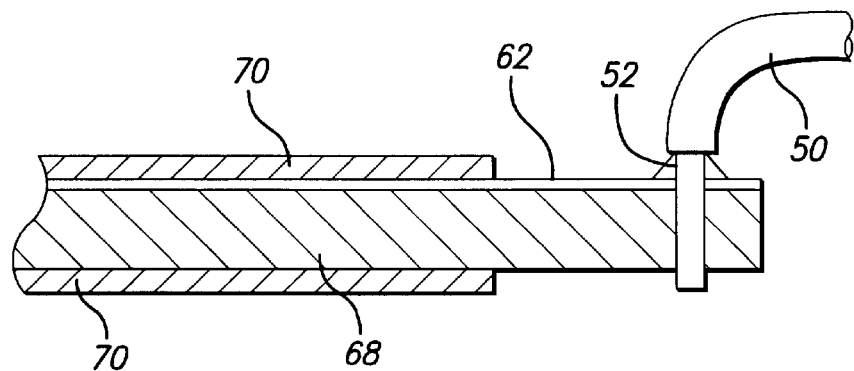
FIG. 5 is a cross-sectional view of a connection portion of the sealing assembly of the container shown in FIG. 1.

With reference to FIG. 5, the seal assembly 14 further includes an insulating substrate 68 and sealing layers 70. In this embodiment, the insulating substrate, sealing layers, and conductive elements 62 are formed of standard printed circuit board materials. Specifically, the insulating substrate and sealing layers are formed from an epoxy resin with glass filler, commonly referred to as FR-4 material, and the conductive elements are made of copper and are placed on the insulating substrate in a manner commonly known in the art. More specifically, one-ounce or two-ounce copper with a purity of 99.5% is preferably used, which corresponds to conductive element thicknesses of 34 μm and 68 μm, respectively. In this embodiment, this facilitates the sealing layer to provide a consistent mating surface with the upper chamber plate and O-rings 38. The sealing layer is disposed on upper and lower surfaces of the insulating substrate/conductive elements combination. Other materials having appropriate sealant proprieties to may be implemented without departing from the invention.

Figure 6:
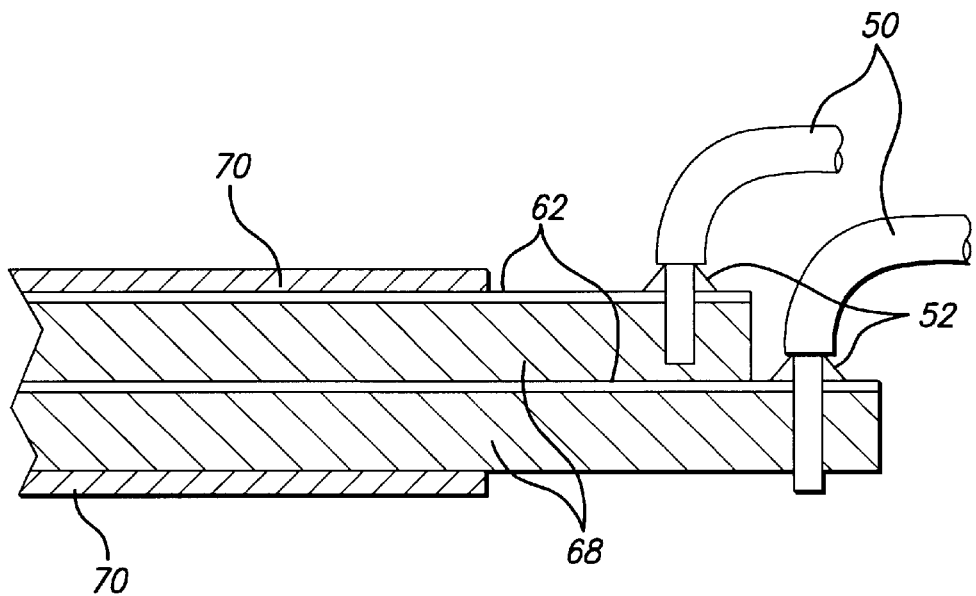
FIG. 6 is a cross-sectional view of a connection portion of an alternate embodiment of the sealing assembly.

FIG. 6 depicts a second preferred embodiment of the seal assembly 14 providing multiple layers of conductive elements 62 and insulating substrates 68. Specifically, this embodiment comprises a multilayered circuit board with sealing layer 70 disposed on the upper and lower surfaces. Also, in other embodiments, the components can be mounted on the seal assembly directly, making a separate component assembly 20 unnecessary. It should be appreciated that the seal assembly can be beneficially used in other embodiments which are required to withstand high pressure differentials and allow power and signal transmissions to pass. It should also be appreciated that the seal assembly can be constructed of other materials exhibiting similar characteristics. For example, optical fibers embedded in a titanium plate with a sealant layer on the external surfaces may be implemented in other embodiments. Also, conductive material within a carbon fiber foil sheet having a sealant layer alternatively may be used.

Figure 7:
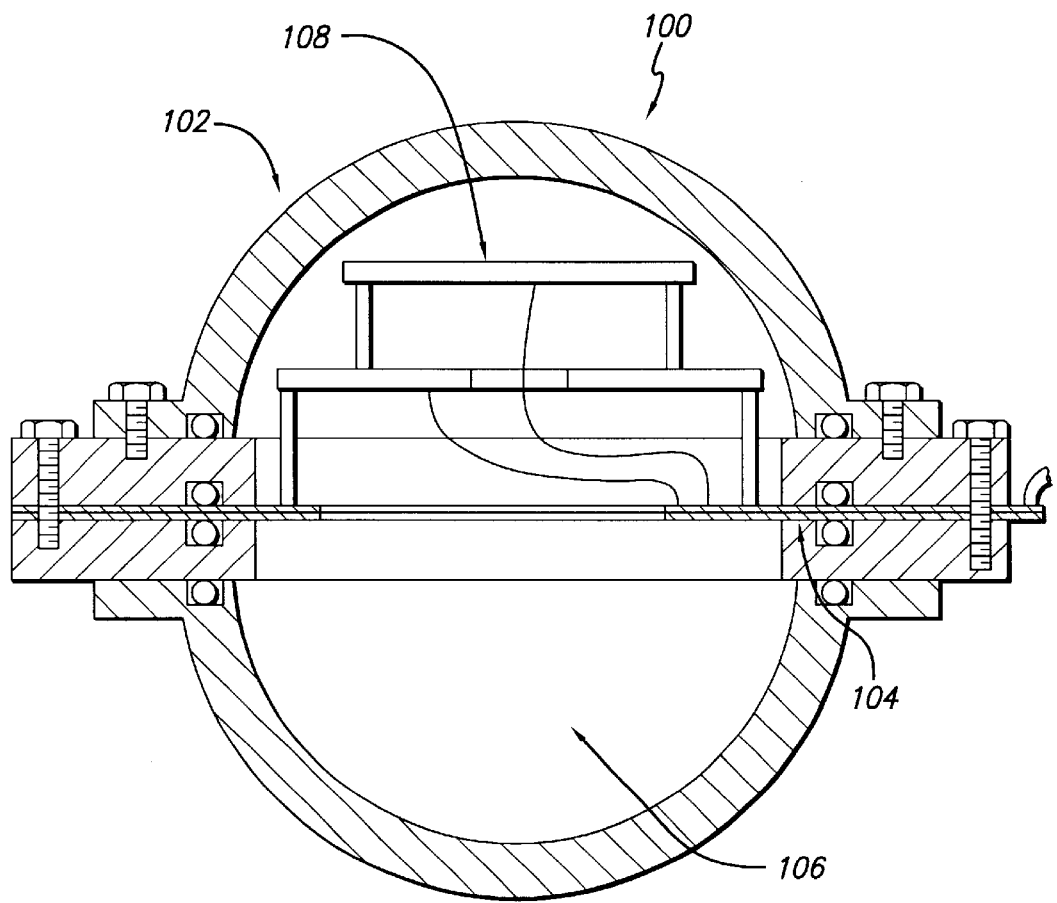
FIG. 7 is a side cross-sectional view of an alternate embodiment of a pressure container in accordance with the invention.

FIG. 7 depicts an alternate embodiment of the present invention for applications without need for an enclosed ambient chamber. In this embodiment, a container 100 includes a housing assembly 102 and a seal assembly 104, providing an sealed chamber 106 having a predetermined pressure, and a component assembly 108. The housing assembly and the seal assembly are configured to withstand a high pressure differential between the predetermined pressure and ambient pressure in a manner discussed above. In some applications, the container may be configured to provide predetermined pressure substantially exceeding an ambient pressure region of approximately one kg/cm².

The foregoing detailed description of the present invention is provided for the purposes of illustration and is not intended to be exhaustive or to limit the invention to the precise embodiments disclosed. Accordingly, the scope of the present invention is defined by the following claims.

We claim:

1. A pressure container that defines a sealed chamber having a first pressure, the sealed chamber being positioned in proximity to a pressure region at a second pressure external to the sealed chamber, the container comprising:
a housing defining a first chamber configured to maintain a first pressure level and having two spaced-apart, confronting walls positioned between the first chamber and a pressure region external to the first chamber;
a seal assembly positioned between the confronting walls, the seal assembly including,
a planar substrate,
a conductive element attached to the planar substrate and extending between the first chamber and the pressure region external to the first chamber for conducting a signal between the first chamber and the pressure region, and
first and second seals positioned on opposite sides of the planar substrate and adapted to sealably interface with the confronting walls of the housing; and
one or more securement members that compress the confronting walls of the housing against the seal assembly, to seal the first chamber and thereby define a boundary between the first chamber and the pressure region, wherein the housing and the seal assembly are configured to withstand a pressure differential between the first chamber and the pressure region.

2. A pressure container as defined in claim 1, further comprising an electrical component positioned within the first chamber and connected to the conductive element.

3. A pressure container as defined in claim 1, wherein the conductive element is configured to conduct optical signals.

4. A pressure container as defined in claim 1, wherein the pressure region is external to the housing.

5. A pressure container as defined in claim 1, wherein the pressure region is bound within the housing and the second pressure level is adjustably maintained at ambient pressure.

6. A pressure container as defined in claim 1, wherein the housing and the seal assembly are configured to maintain a pressure within the first chamber that is at least 100 kg/cm² greater than ambient pressure.

7. A pressure container as defined in claim 1, wherein the planar substrate and the conductive element are made of printed circuit board material.

8. A pressure container as defined in claim 7, wherein the sealing assembly further includes a second planar substrate made of printed circuit board insulating material positioned in proximity to the first planar substrate.

9. A pressure container as defined in claim 7, wherein the sealing assembly further includes a optical conductive element extending between the first chamber and the pressure region external to the first chamber.

10. A pressure container as defined in claim 1, wherein, the housing includes a first chamber plate in opposed relation to a second chamber plate, and the chamber plates sandwich the seal assembly therebetween.

11. A pressure container as defined in claim 10, wherein, the housing further includes a first atmospheric cover positioned in opposed relation to a second atmospheric cover which aid in defining the first chamber, and the atmospheric covers sandwich the chamber plates therebetween.

12. A pressure container as defined in claim 11, wherein the pressure region is bound within the housing and the second pressure level is adjustably maintained at ambient pressure.

13. A pressure container comprising:
a housing defining,
a first chamber configured to maintain a first pressure level,
a second chamber configured to maintain a second pressure level substantially matching ambient pressure, and
two spaced-apart, confronting walls positioned between the first and second chambers;

a seal assembly positioned between the confronting walls, including
   a planar insulating substrate,
   an electrically conductive element attached to the insulating substrate and extending between the first chamber and the second chamber, and
   a seal positioned adjacent to the insulating substrate and adapted to sealably interface with a confronting wall of the housing; and
one or more securement members that compress the confronting walls of the housing against the seal assembly, to seal the first chamber and thereby define a boundary between the first chamber and the second chamber, wherein the housing and the seal assembly are configured to withstand a pressure differential between the first chamber and the second chamber.

14. A pressure container as defined in claim 13, further comprising an electrical component positioned within the first chamber and connected to the electrically conductive element.

15. A pressure container as defined in claim 13, wherein the seal assembly is integral with the housing on a side of the seal assembly opposing the seal.

16. A pressure container as defined in claim 13, wherein the housing and the seal assembly are configured to maintain the pressure differential between the first and second chambers above 100 kg/cm$^2$.

17. A pressure container as defined in claim 13, wherein the insulating substrate and the conductive element are made of printed circuit board material.

18. A pressure container as defined in claim 17, wherein the sealing assembly further includes a second insulating substrate made of printed circuit board insulating material positioned in proximity to the first insulating substrate.

19. A pressure container as defined in claim 13, wherein, the housing includes a first chamber plate in opposed relation to a second chamber plate, and the chamber plates sandwich the seal assembly therebetween.

20. A pressure container as defined in claim 19, wherein, the housing further includes a first atmospheric cover positioned in opposed relation to a second atmospheric cover which aid in defining the first chamber, and the atmospheric covers sandwich the chamber plates therebetween.

21. A pressure container comprising:
   a housing defining,
      a first chamber configured to maintain a first pressure level,
      a second chamber configured to maintain a second pressure level substantially matching ambient pressure, and
      two spaced-apart, confronting walls positioned between the first and second chambers;
   a seal assembly positioned between the confronting walls, the seal including
      a planar insulating substrate,
      an electrically conductive element attached to the insulating substrate and extending between the first chamber and the second chamber, and
      a seal positioned adjacent to an external side of the insulating substrate and adapted to sealably interface with a confronting wall of the housing;
   an electrical component positioned within the first chamber and connected to the electrically conductive element; and
   one or more securement members that compress the confronting walls of the housing against the seal assembly, to seal the first chamber and thereby define a boundary between the first chamber and the second chamber, wherein the housing and the seal assembly are configured to withstand a pressure differential between the first chamber and the second chamber.

22. A pressure container as defined in claim 21, wherein the insulating substrate and the conductive element are made of printed circuit board material.

23. A pressure container as defined in claim 21, wherein the seal assembly is integral with the housing on a side of the seal assembly opposing the seal.

24. A pressure container as defined in claim 21, wherein the housing and the seal assembly are configured to maintain the pressure differential between the first and second chambers above 100 kg/cm$^2$.

25. A pressure container as defamed in claim 24, wherein, the housing includes a first chamber plate in opposed relation to a second chamber plate, and the chamber plates sandwich the seal assembly therebetween.

26. A pressure container as defined in claim 25, wherein, the housing further includes a first atmospheric cover positioned in opposed relation to a second atmospheric cover which aid in defining the first chamber, and the atmospheric covers sandwich the chamber plates therebetween.

\* \* \* \* \*

UNITED STATES PATENT AND TRADEMARK OFFICE
CERTIFICATE OF CORRECTION

PATENT NO. : 6,590,158 B1
DATED : July 8, 2003
INVENTOR(S) : Tyler Schilling, William P. Klassen and David Davis It is certified that error appears in the above-identified patent and that said Letters Patent is hereby corrected as shown below:

Column 8,
Line 37, change "defamed" to -- defined --.

Signed and Sealed this

Nineteenth Day of August, 2003

JAMES E. ROGAN
*Director of the United States Patent and Trademark Office*